United States Patent [19]

Baynes

[11] Patent Number: 4,636,825

[45] Date of Patent: Jan. 13, 1987

[54] DISTRIBUTED FIELD EFFECT TRANSISTOR STRUCTURE

[75] Inventor: Martin J. Baynes, Cape Elizabeth, Me.

[73] Assignee: Fairchild Semiconductor Corporation, Cupertino, Calif.

[21] Appl. No.: 784,810

[22] Filed: Oct. 4, 1985

[51] Int. Cl.⁴ ............................................. H01L 29/78
[52] U.S. Cl. .................................. 357/23.14; 357/41; 357/45
[58] Field of Search .................... 357/41, 45, 23.14

[56] References Cited

U.S. PATENT DOCUMENTS

| 4,015,278 | 3/1977 | Fukuta | 357/23.14 |
| 4,287,571 | 9/1981 | Chakravarti et al. | 357/41 |
| 4,566,022 | 1/1986 | Kalter | 357/23.14 |

*Primary Examiner*—Edward J. Wojciechowicz
*Attorney, Agent, or Firm*—Kenneth Olsen; David H. Carroll; Daniel H. Kane, Jr.

[57] ABSTRACT

A field effect transistor (FET) structure suitable for MOS and CMOS IC fabrication processes includes spaced apart alternating source and drain regions distributed in a rectangular checkerboard pattern of horizontal and vertical rows. A first grid of intersecting horizontal and vertical conductive gate lines overlaps adjacent source and drain regions of the array and is dielectrically isolated from the source and drain regions by an insulating layer. The horizontal and vertical gate lines provide a single gate element distributed across the array which reduces FET channel length and channel resistance. A second grid comprising a set of parallel diagonal alternating source lead lines and drain lead lines is dielectrically isolated from the first grid. The source lead lines are electrically coupled to source regions and drain lead lines to drain regions. The second grid includes a first metal layer of diagonal source and drain lead lines and a second metal layer overlying at least a portion of the first metal layer. The first and second metal layers are selectively coupled to reduce current density and resistance in the diagonal lead lines without increasing the width of the lead lines. Back contact areas or regions are distributed around the perimeter of the checkerboard pattern forming a back contact guard ring or band.

14 Claims, 1 Drawing Figure

DISTRIBUTED FIELD EFFECT TRANSISTOR STRUCTURE

TECHNICAL FIELD

This invention relates to an improved metal oxide semiconductor (MOS) field effect transistor (FET) structure having distributed source, drain and gate elements suitable for fabrication on integrated circuit chips. The invention is particularly directed to complementary metal oxide semiconductor (CMOS) transistors and CMOS fabrication processes for high power buffers and output stages.

BACKGROUND ART

Conventional MOS transistors are fabricated with spaced apart source and drain regions of semiconductor material of one polarity diffused or otherwise embedded in a semiconductor substrate of opposite polarity. An insulating layer is formed over the surface. A first metal layer strip penetrates through a window to the source region and provides the source lead while a second metal strip penetrates to the drain region and provides the drain lead. A third conductive strip lies on top of the insulating layer and overlaps the source and drain regions to provide a gate. Voltage signals at the gate control the flow of current between the source and drain by the effect of the signal field in establishing or enhancing a temporary conductive channel between the source and drain or by blocking or depleting a preformed channel.

A back contact region may also be provided adjacent to and in electrical contact with the source region. The back contact region is of second polarity, that is, conductivity type opposite the source and the same as the substrate but with greater concentration of carriers. The back contact region serves to draw stray currents but of the substrate and thereby reduce interference by substrate currents in the operation of the transistor.

In P-channel enhancement type FET's, P-regions are diffused in the surface of an N-type silicon substrate to form the spaced apart source and drain areas or regions. An N+ diffusion is used to form a back contact region adjacent to the source region. A silicon dioxide layer or oxide layer is formed over the surface with appropriate windows for leads. Metal layer strips or leads are then formed to provide the source lead, drain lead and gate. The back contact region is electrically coupled to the source. In N-channel enhancement type FET's, N regions are diffused in the surface of a P-type well formed in the silicon substrate to provide the spaced apart source and drain regions. A P+ diffusion forms the back contact region adjacent to the source. An insulating oxide layer is similarly formed over the surface with metal layer strips for the leads and gate.

In CMOS integrated circuits P-channel and N-channel transistors are coupled in complementary pairs. Typically the gates are coupled together to provide an input, the drains are coupled together to provide an output, and one source is coupled to the voltage power supply while the other is coupled to ground. An input signal turns one transistor of the CMOS pair on and the other off so that virtually no current flows except when the output switches from one state to another. Power dissipation is very low and the noise margin high.

The efficiency and switching speed of MOS and CMOS transistors are primarily a function of the channel resistance between the source and drain regions and the output or load capacitance. The channel resistance depends on the geometry of the channel and can be reduced by decreasing the length of the transistor channel, that is the distance between source and drain regions, and increasing the width or cross sectional area of the channel. The output capacitance is a function of the area size of the drain region and can be minimized by making the drain region smaller.

In order to improve the performance of FET's in MOS and CMOS integrated circuits, distributed MOS and CMOS transistor structures have been developed to reduce drain size and drain area thereby reducing output load capacitance, and to increase FET channel width relative to length to reduce channel resistance. According to the current CMOS distributed transistor structure, for example P-channel and N-channel CMOS FET's, the source element and drain element of the transistor are divided and distributed into an array of a plurality of alternating spaced apart source and drain regions distributed in a "checkerboard" of diagonal rows. Similarly, the gate element of the distributed transistor is distributed across the array in the form of two sets of orthogonally intersecting diagonal lines, strips or tracks of conductive polysilicon or other conductive material overlapping adjacent source and drain areas. As a result, a plurality of functional FET areas or regions are distributed across the array. The grid of intersecting diagonal polysilicon tracks is dielectrically isolated from the array of source and drain regions by an insulating layer of silicon dioxide referred to as the oxide layer.

For a P-Channel FET, this initial structure is formed by growing an insulating oxide layer across the N-type silicon substrate and depositing the first grid of two sets diagonal orthogonally intersecting polysilicon gate lines or tracks over the oxide layer. After preparation for the self-aligned mask procedure, P-type dopant material is diffused into the source and drain regions defined by the openings in the first grid of polysilicon gate lines. Lateral diffusion of the source and drain regions underlies the gate lines or tracks forming distributed FET areas or regions across the array.

The diffusion step also diffuses dopant molecules into the grid of polysilicon gate lines so that the gate lines are conductive. These orthogonally intersecting diagonal polysilicon gate lines or strips of the distributed gate element are electrically coupled together to provide a single gate distributed across the array. Additional masking and diffusion steps may be included in the fabrication process to distribute back contact regions of polarity or conductivity opposite the source and drain regions adjacent to the source regions.

Following growth of another oxide layer a second grid of either horizontal or vertical metal layer strips is formed over the array to provide source and drain leads dielectrically isolated from the first grid of diagonal polysilicon lines. The metal layer strip source leads contact the source regions through windows in the oxide layers while the drain leads penetrate through to the drain regions. The source leads are electrically coupled to provide a single distributed source lead across the array while the drain leads are similarly coupled.

The orthogonally intersecting diagonal polysilicon gate lines or strips of the distributed gate are electrically coupled together to provide a single distributed gate across the array.

As a result of the distribution of source regions around a single drain region, the area of the drain regions and the output capacitance of the transistor are reduced in comparison with undistributed MOS and CMOS FET structures such as single stripe and double stripe FET's. Furthermore, the width of the FET elements relative to channel length is improved thereby reducing channel resistance.

OBJECTS OF THE INVENTION

It is an object of the present invention to provide improved MOS and CMOS distributed FET structures which further reduce channel length relative to width thereby decreasing channel resistance in MOS and CMOS integrated circuits.

Another object of the invention is to provide distributed MOS and CMOS FET structures with reduced current density, resistance and dissipation in the source and drain lead lines of distributed FET structures without increasing drain area and output capacitance.

A further object of the invention is to provide distributed MOS and CMOS FET transistor structures in efficient geometrical configurations and arrangements for reducing overall transistor area size; for controlling signal densities and signal propagation times across the structure: and for organization of back back contact regions in close electrical proximity to source regions while at the same time providing a back contact guard ring or band around the perimeter of the distributed transistor structure array for dissipating stray currents in the substrate.

It is also intended by the new geometrical configuration and arrangement to increase width of the FET channels while decreasing length during the oxide isolation process in fabrication of MOS and CMOS integrated circuit chips, further reducing FET channel resistance.

DISCLOSURE OF THE INVENTION

In order to accomplish these results, the present invention provides an improved FET structure suitable for MOS and CMOS IC fabrication processes, having source, drain and gate elements in which the alternating spaced apart source and drain areas or regions of the array are distributed in a checkerboard pattern of horizontal and vertical rows. Each drain area is surrounded on the sides by spaced apart source areas or regions to minimize drain area and output load capacitance. The source and drain areas comprise semiconductor material of first polarity or first conductivity type embedded in semiconductor material of second polarity.

According to the invention, a first grid of horizontal and vertical gate lines or tracks for example of polysilicon material overlaps adjacent source and drain areas of the array. The first grid of horizontal and vertical gate lines is dielectrically isolated from the source and drain regions by an insulating layer such as a silicon dioxide layer providing a plurality of FET areas or regions across the array. The horizontal and vertical gate lines of the first grid are electrically coupled to provide a single gate element distributed across the array.

A feature and advantage of the first grid configuration of orthogonally intersecting horizontal and vertical gate lines is that the FET channel length between source and drain areas is effectively reduced by a factor of one over the square root of two in comparison with conventional distributed FET structures using diagonal intersecting gate lines. Thus, the width relative to length of the FET P or N channels between source and drain regions is increased across the array thereby reducing channel resistance.

The invention also provides a second grid in the form of a set of parallel diagonal alternating source lead lines and drain lead lines of conducting strips such as metal layer strips dielectrically isolated from the first grid by an insulating layer for example an oxide layer. The source lead lines are electrically coupled to the source regions or areas through windows and to each other to provide a single source element distributed across the array. The drain lead lines are similarly electrically coupled to the drain regions or areas and to each other to provide a single drain element distributed across the array. The result is a distributed FET structure of parallel coupled FET regions or areas with decreased channel length and reduced channel resistance distributed across the array.

The second grid includes a first metal layer deposited over the oxide insulating layer, and a second metal layer formed over at least a major portion of the first metal layer along the source and drain lead lines to reduce current density and resistance in the source and drain lead lines without increasing the width of the lead lines, the drain area, or output capacitance. Reduced current density avoids problems of electromigration of the metallized leads. In the fabrication process and structure according to the invention the second metal layer is dielectrically isolated from the first metal layer by an insulating layer such as an oxide layer. The first and second metal layers are electrically coupled along the source lead lines and drain lead lines by selective electrical contacts between the metal layers.

In the structure contemplated by the invention, the first metal layer extends beyond the ends of either the source lead lines or drain lead lines typically the source lead lines, affording a common lead for the source lead lines. The second metal layer terminates inside the ends of the source lead lines but serves to reduce the resistance of the source lead lines. On the other hand, the second metal layer extends beyond the ends of the other of the source lead lines or drain lead lines, typically the drain lead lines affording a common lead to the drain lead lines. In the drain lead lines therefore the first metal layer terminates inside the ends but serves to reduce resistance in the drain lead lines.

The invention also provides a new arrangement of back contact regions or areas in which the back contact regions of polarity or conductivity opposite the source and drain are distributed around the perimeter of the array. The back contact perimeter is electrically coupled to the source lead lines. A feature and advantage of this geometry is that the electrically coupled back contact regions provide a back contact guard ring or band around the distributed FET regions for draining stray currents and avoiding interference in the operation of the transistor.

According to a preferred example embodiment, the array of horizontal and vertical rows of source and drain regions is arranged in a rectangle elongate in the horizontal row direction with reduced height for reducing the length of the diagonal source and drain lead lines, the number of FET areas served by the lead lines, and therefore the current density. A feature and advantage of the elongate rectangle configuration is that the back contact areas are brought into close proximity to the source regions and FET regions of the array while at the same time providing the back contact guard ring around the perimeter of the array. So called "latch-up" of CMOS transistor pairs from stray currents is thereby avoided.

Control of propagation time for gate signals across the array is also afforded by the rectangular configuration of the present invention. This is accomplished by selecting the gate lead access location along the lines of the first grid either along the short vertical lines or the longer horizontal lines for faster or slower propagation time. Use of the first grid of gate lines as a transmission line for longer or slower propagation time is advantageous to avoid ringing from large gate signals across the first grid in high power buffers and drives. Another feature of the rectangle geometry of the present invention is that the oxide isolation effects are limited to the perimeter of the FET structure and maximum benefit is afforded from the lateral diffusion in the source and drain regions which increases width and reduces length of FET channels across the array, improving the performance of the transistor.

The invention contemplates incorporation of the new distributed FET structures in MOS and CMOS IC fabrication processes particularly for high power buffers and output stages. Other objects features and advantages of the invention are set forth in the following specification and accompany drawing.

BRIEF FIGURE DESCRIPTION

FIG. 1 is a diagrammatic view provided by a simplification of a computer plot of a distributed FET structure according to the invention suitable for MOS and CMOS integrated circuits.

DESCRIPTION OF PREFERRED EMBODIMENT AND BEST MODE OF THE INVENTION

Figure 1:
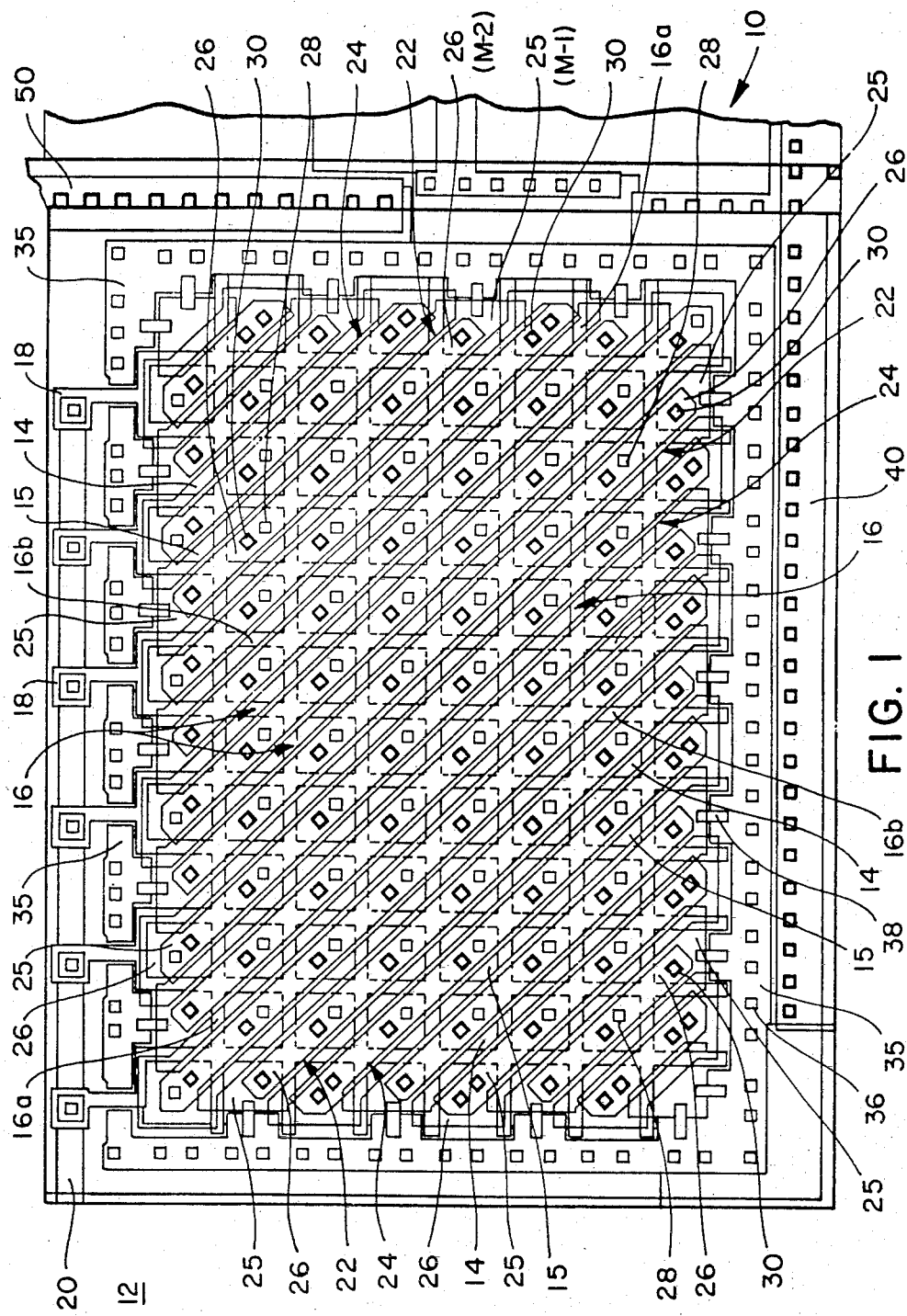

In the distributed field effect transistor structure 10 according to the present invention illustrated in FIG. 1, an array of source regions 14 and drain regions 15 of semiconductor material of one polarity are embedded in a silicon substrate 12 of opposite polarity. The substrate may be a portion of an integrated circuit chip. The source and drain regions 14,15 are distributed in a checkerboard pattern of horizontal and vertical rows with source and drain regions alternating so that each drain region or area 15 is surrounded on the sides by source regions or areas 14.

The source and drain regions are formed by depositing a first grid 16 of intersecting horizontal gate lines, paths or tracks 16a and vertical gate lines, paths or tracks 16b over the surface of the substrate 12 properly prepared with an oxide layer. The first grid 16 provides a self aligned transistor mask for diffusion according to well known procedures of the source and drain regions with either N-type or P-type dopant material according to whether an N-channel or P-channel FET is fabricated. The self aligned masking and diffusion step controls the lateral diffusion so that the source and drain regions are spaced apart and the gate lines 16a and 16b overlap adjacent source and drain regions to provide FET regions across the array.

As shown in this example embodiment the array configuration is a rectangle elongate in the horizontal row direction and the direction of the horizontal gate line 16a. The horizontal dimension of the rectangle is 50% longer than the vertical height of the rows and vertical gate lines 16b, affording the advantages of the invention summarized above. In this example the gate lines of first grid 16 are electrically coupled at contacts 18 by the shorter vertical gate lines 16b to the gate lead 20. Thus, the first grid provides a single gate element distributed across the array with the faster signal propagation time afforded by the shorter gate lead lines 16b. Slower propagation time for high power gate signals would be afforded by coupling the gate lead 20 instead to the longer horizontal gate lines 16a.

The alternating source lead lines 22 and drain lead lines 24 form the second grid of parallel diagonal lead lines deposited over the first grid and dielectrically isolated from the first grid by another oxide layer. According to the invention the source and drain lead lines 22,24 are formed by two metal layers, a first metal layer strip 25 which extends beyond the ends of the source lead lines 22 to provide a common source lead, and a second metal layer strip 26 which extends beyond the ends of the drain lead lines 24 to provide a common drain lead.

Looking at the source lead lines, the second metal layer strip 26 terminates inside the ends of the source lead lines 22 and at this location serves only to reduce resistance and current density in the source lead lines. On the other hand, looking at the drain lead lines, the first metal layer strip 25 terminates inside the ends of the drain lead lines 24 and at this location serves only to reduce resistance and current density in the drain lead lines.

The first metal layer 25 and second metal layer 26 are dielectrically isolated from each other by a silicon dioxide layer but are selectively coupled to each other by electrical contacts 30 which penetrate through the oxide layer between the metal layers along the source and drain leads lines only. The first metal layer 25 provides the contacts to the respective source and drain regions along the respective source and drain lead lines. Thus, the first metal layer 25 is coupled to the source regions 14 along the source lead lines 22 by contacts 28 and is coupled to the drain regions 15 by similar contacts 28 along the drain lead lines 24.

The masking and diffusion steps are also used according to the invention to embed back contact regions 35 in the substrate 12 in a ring or band around the perimeter of the array Thus, the back contact regions provide a back contact guard ring or band around the FET transistor structure while at the same time remaining in close proximity to the FET regions of the array because of the elongate rectangular configuration and geometry. The back contact band 35 is electrically coupled to the source lead lines and source regions by the long contacts 38 and to the substrate by back contacts 36.

The various layers of the distributed FET structure and chip in which it is integrated are constructed and arranged so that, for example the first metal layer or M-1 layer 25 is coupled to a common source lead 40 which in turn may lead to a die pad of the IC chip for bonding a source lead wire to the lead frame package. Similarly, the second metal layer or M-2 layer 26 may be coupled to a common drain lead 50 which in turn may lead to another die pad of the IC chip for bonding a drain lead wire to the lead frame package.

In a CMOS coupling of complementary P-channel and N-channel distributed FET's constructed according to the invention, the first grid gate lines or paths of the complementary pair are typically coupled together to provide the single input, the drain lead lines of the complementary pair are typically coupled together to provide the single output, and the source lead lines of one of the complementary pair are coupled to the voltage power supply $V_{cc}$ while the source lead lines of the other are coupled to ground. The improved FET structure has a variety of applications in integrated circuits and devices and while the invention has been described with reference to particular example embodiments it is intended to cover all modifications, variations and equivalents within the scope of the following claims.

I claim:

1. An improved metal oxide semiconductor (MOS) field effect transistor (FET) comprising a single transistor in a distributed structure having source, drain, and gate elements distributed in an array for fabrication on integrated circuit chips, said array comprising a plurality of spaced apart alternating source and drain areas of semiconductor material of first polarity, said source and drain areas being formed in semiconductor material of second polarity and distributed in a checkerboard pattern so that each drain area is surrounded on the sides by spaced apart source areas, a first grid of conductive gate paths overlapping adjacent source and drain areas, said gate paths being dielectrically isolated from the source and drain areas by an insulating layer thereby providing a plurality of FET areas across the array, said gate paths of the first grid being electrically coupled together to provide a single gate element distributed across the array, and a second grid of electrically conducting source and drain lead lines dielectrically isolated from the first grid by an insulating layer, said second grid comprising source lead lines electrically coupled to each other and to the source areas of the array to provide a single source element distributed across the array and drain lead lines electrically coupled to each other and to the drain areas of the array to provide a single drain element distributed across the array thereby parallel coupling the FET areas across the array, the improvement characterized in that:

said array comprises source and drain areas (14, 15) arranged in horizontal and vertical rows;

said first grid (16) comprises a grid of intersecting horizontal and vertical gate paths (16a, 16b) overlapping adjacent source and drain areas (14, 15) thereby decreasing the channel length and channel resistance of the FET areas said horizontal and vertical gate paths (16a, 16b) intersecting orthogonally and being electrically coupled at the intersections so that the first grid (16) comprises a single distributed gate element of the single transistor distributed structure (10) with a common gate lead (20); and said second grid comprises a grid of parallel diagonal alternating source lead lines (22) and drain lead lines (24), said second grid being formed by a first metal layer (25) comprising lower level diagonal lead lines, and a second metal layer (26) comprising upper level diagonal lead lines formed over at least a major portion of the lower level diagonal lead lines of the first metal layer, said first and second metal layers being separated by a dielectric layer with electrical contacts (30) through the dielectric layer between the first and second metal layers along the lower level and upper level diagonal lead lines to reduce current density and resistance in the source and drain lead lines (22, 24) without increasing the width of said lead lines;

said first metal layer (25) extending beyond the ends of either one of said source and drain lead lines (22, 24) and being electrically coupled to provide a first common lead line (40) for one of said source and drain lead lines and said second metal layer (26) extending beyond the ends of the other of said source and drain lead lines and being electrically coupled to provide a second common lead line (50) for the other of said source and drain lead lines.

2. The FET of claim 1 further comprising a back contact element comprising back contact areas (35) of semiconductor material of second polarity forming a perimeter distributed around the rectangle of source and drain areas, said perimeter of back contact areas (35) being electrically coupled to the source areas (14) by electrical contacts (38) for draining stray currents from the semiconductor material.

3. The FET of claim 2 wherein the second metal layer (26) upper level diagonal lead lines terminate before respective ends of said source lead lines (22) inside the perimeter around the rectangle of source and drain areas (14, 15) and before respective ends of the first metal layer (25) lower level diagonal lead lines.

4. The FET claim 3 wherein the first metal layer (25) lower level diagonal lead lines extend beyond the respective ends of the source lead lines (22) and wherein the lower level diagonal lead lines of the first metal layer (25) comprising source lead lines (22) are electrically coupled to the back contacts areas (35) at the perimeter of the rectangle of source and drain areas by electrical contacts (38).

5. The FET of claim 1 wherein the rectangle of source and drain areas is elongate in the horizontal row direction relative to vertical height thereby reducing the length of the diagonal source and drain lead lines (22, 24) and decreasing the current passing through said source and drain lead lines (22, 24) to respective parallel coupled FET areas and wherein the back contact areas (35) are arranged in said perimeter around the rectangle in close proximity adjacent to said FET areas.

6. A CMOS FET pair comprising first and second FET's as set forth in claim 1 wherein said first FET comprises source and drain areas of semiconductor material of first polarity buried in semiconductor material of second polarity and wherein the second FET comprises source and drain areas of semiconductor material of second polarity buried in semiconductor material of first polarity, wherein the first grid gate element paths of the FET pair are electrically coupled together to provide an input, wherein the drain element lead lines of the FET pair are electrically coupled together to provide an output, and wherein the source element lead lines of one of the FET's are coupled to a voltage source power supply $V_{cc}$, and wherein the source element lead lines of the other FET are coupled to ground thereby providing a distributed CMOS FET pair.

7. A CMOS FET pair comprising first and second transistors each as set forth in claim 1 coupled in CMOS configuration.

8. The FET of claim 1 wherein the source and drain areas (14, 15) are arranged in a rectangle elongate in the horizontal row direction relative to vertical height so that the vertical gate paths (16b) are relatively shorter than the horizontal gate paths (16a) and wherein the relatively shorter vertical gate paths (16b) are coupled to a common gate lead (20) to reduce propagation time of gate signals across the first grid (16).

9. The FET of claim 1 wherein the source and drain areas are arranged in a rectangle elongate in the horizontal row direction relative to vertical height, and wherein the elongate horizontal gate paths (16a) are electrically coupled to a gate lead to slow propagation time of gate signals across the first grid to avoid ringing from large signals.

10. A single metal oxide semiconductor (MOS) field effect transistor (FET) having source, drain and gate elements comprising:

an array of a plurality of spaced apart alternating source and drain areas (14, 15) distributed in a checkerboard pattern of horizontal and vertical rows so that each drain area (14) is surrounded on the sides by spaced apart source areas (15) thereby minimizing drain area and output load capacitance, said source and drain areas (14, 15) comprising semiconductor material of first polarity embedded in semiconductor material of second polarity;

a first grid (16) of intersecting horizontal and vertical conductive gate lines (16a, 16b) overlapping adjacent source and drain areas (14, 15) of the array, said first grid being dielectrically isolated from the source and drain areas by an insulating layer thereby providing a plurality of FET areas across the array, said horizontal and vertical gate lines (16a, 16b) of the first grid intersecting orthogonally and being electrically coupled at the intersections to provide a single gate element distributed across the array with a common gate lead (20); and a second grid comprising a set of parallel diagonal alternating source lead lines (22) and drain lead lines (24), said second grid being dielectrically isolated from the first grid by an insulating layer, said source lead lines (22) being electrically coupled to the source areas (14) and to each other (22) to provide a single source element distributed across the array, said drain lead lines (24) being electrically coupled to the drain areas (15) and to each other to provide a single drain element distributed across the array;

said second grid being formed by a first metal layer (25) comprising lower level diagonal lead lines and a second metal layer comprising upper level diagonal lead lines overlying at least a major portion of the first metal layer lower level diagonal lead lines, said first and second metal layers being separated by a dielectric layer and selectively electrically coupled by electrical contacts (30) through the dielectric layer between the first and second metal layers along the lower and upper level diagonal lead lines to reduce current density and lower resistance to current in the diagonal source and drain lead lines (22, 24) without increasing the width of said lead lines;

said first metal layer (25) extending beyond the ends of one of said source and drain lead lines (22, 24) and being electrically coupled to provide a first common lead line (40) for either of said source and drain lead lines and said second metal layer (26) extending beyond the ends of the other of said source and drain lead lines and being electrically coupled to provide a second common lead line (50) for the other of said source and drain lead lines;

thereby providing a single distributed MOS FET of parallel coupled FET areas distributed across the array with decreased channel length relative to channel width and reduced channel resistance.

11. The FET of claim 10 wherein the array of source and drain areas further comprises a perimeter of back contact areas (35) distributed around the checkerboard pattern, said back contact areas (35) forming a back contact guard ring or band (35) comprising semiconductor material of second polarity electrically coupled to the source lead lines (22) by electrical contacts (38) for draining stray currents.

12. The FET of claim 10 wherein the array of source and drain areas (14, 15) comprises an elongate rectangle elongate in the horizontal row direction relative to vertical height thereby reducing the length of the diagonal source and drain lead lines (22, 24) and decreasing the current flowing in the source and drain lead lines to the parallel coupled FET areas, said elongate rectangle configuration further juxtaposing the back contact guard ring (35) in close proximity to the source areas (14).

13. An improved metal oxide semiconductor (MOS) field effect transistor (FET) having source, drain and gate elements comprising:

an array of a plurality of spaced apart alternating source and drain regions (14, 15) distributed in a checkerboard pattern of horizontal and vertical rows so that drain regions (15) are surrounded on sides by source regions (14) thereby minimizing drain area and output load capacitance, said source and drain regions (14, 15) comprising semiconductor material of first polarity embedded in in a substrate of semiconductor material of second polarity;

a ring of back contact regions (35) forming a perimeter distributed around the checkerboard pattern, said back contact regions comprising semiconductor material of second polarity electrically coupled by electrical contacts (38) to the source regions (14) for removing stray currents from the substrate;

a first grid (16) of horizontal and vertical gate lines (16a, 16b) overlapping adjacent source and drain regions (14, 15) of the array, said first grid (16) being dielectrically isolated from the source and drain regions (14, 15) by an insulating layer thereby providing a plurality of FET regions across the array, said horizontal and vertical gate lines (16a, 16b) of the first grid intersecting orthogonally and being electrically coupled at the intersections to provide a single gate element distributed across the array with a common gate lead (20);

a second grid comprising a set of parallel diagonal alternating source lead lines (22) and drain lead lines (24), said second grid being dielectrically isolated from the first grid by an insulating layer, said source lead lines (22) being electrically coupled to the source regions (14) and to each other (22) to provide a single source element distributed across the array, said drain lead lines (24) being electrically coupled to the drain regions (15) and to each other (24) to provide a single drain element distrubted across the array thereby providing a single distributed MOS FET of parallel coupled FET regions with decreased channel length and reduced channel resistance distributed across the array;

said second grid comprising a first metal layer (25) of parallel diagonal lower level lead lines and a second metal layer (26) of parallel diagonal upper level lead lines overlying at least a major portion of the first metal layer lower level diagonal lead lines, said first and second metal layers being separated by a dielectric layer and selectively electrically coupled by electrical contacts (30) through the dielectric layer between the first and second metal layers along the lower and upper level lead lines to reduce current density and lower resistance to current in the diagonal source and drain lead lines (22, 24) without increasing the drain area and channel resistance;

said first metal layer (25) extending beyond the ends of either one of said source and drain lead lines (22, 24) and being electrically coupled to provide a first common lead line (40) for one of said source and drain lead lines and said second metal layer (26) extending beyond the ends of the other of said source and drain lead lines and being electrically coupled to provide a second common lead line (50) for the other of said source and drain lead lines;

said checkerboard pattern of horizontal and vertical rows of source and drain regions being arranged in a rectangle configuration elongate in the horizontal row direction relative to vertical height so that the length of the diagonal source and drain lead lines (22, 24) is reduced thereby reducing the current passing through said source and drain lead lines to respective parallel coupled FET regions of the array and so that the ring of back contact regions (35) is in close proximity to the FET regions of the array while forming a guard band or ring around the array;

said vertical gate paths (16b) being relatively shorter than the horizontal gate paths (16a) and said common gate lead (20) being coupled to the relatively shorter vertical gate paths (16b) to reduce propagation time of gate signals across the first grid (16).

14. A CMOS FET transistor pair comprising a P-channel FET and a N-Channel FET each constructed as set forth in claim 13, said pair of transistors being coupled in CMOS configuration.

* * * * *